United States Patent [19]
Shimizu

[11] Patent Number: 6,127,100
[45] Date of Patent: Oct. 3, 2000

[54] METHOD OF MANUFACTURING A STAMPER FOR USE IN OPTICAL INFORMATION RECORDING MEDIUM

[75] Inventor: Akihiko Shimizu, Kanagawa-ken, Japan

[73] Assignee: Ricoh Company, Ltd., Yokohama, Japan

[21] Appl. No.: 09/288,101

[22] Filed: Apr. 8, 1999

[30] Foreign Application Priority Data

Apr. 8, 1998 [JP] Japan ................................. 10-095779

[51] Int. Cl.⁷ .................................................. G11B 7/26
[52] U.S. Cl. ........................ 430/320; 430/321; 430/945
[58] Field of Search .................................. 430/320, 321, 430/945, 270.11

[56] References Cited

U.S. PATENT DOCUMENTS

| | | | |
|---|---|---|---|
| 4,837,130 | 6/1989 | Ohta et al. | 430/321 |
| 5,238,786 | 8/1993 | Kashiwagi | 430/321 |

FOREIGN PATENT DOCUMENTS

| | | |
|---|---|---|
| 6-131707 | 5/1994 | Japan . |
| 6-243512 | 9/1994 | Japan . |
| 6-302015 | 10/1994 | Japan . |
| 7-287874 | 10/1995 | Japan . |
| 9-106584 | 4/1997 | Japan . |

*Primary Examiner*—John A. McPherson
*Attorney, Agent, or Firm*—Dickstein Shapiro Morin & Oshinsky LLP

[57] ABSTRACT

The invention relates to a method of manufacturing a stamper with a uniform groove having a width smaller that the beam diameter of the exposure light spot for use with the optical information recording medium. In the method of manufacturing the stamper for exposing and developing the photoresist layer on the glass base plate, a water-soluble resin layer having a film thickness equal to the depth of the groove formed on the surface of the stamper is provided between the glass base plate (master plate) and the photoresist layer. A micro-pattern is formed on the photoresist layer by way of exposing the master plate. The photoresist layer is used as a mask. A micro-pattern is formed on the lower layer (water-soluble resin layer), by etching the water-soluble resin layer. Thereafter, the photoresist layer is removed. In this way, the glass master plate has a micro-pattern formed thereon.

34 Claims, 10 Drawing Sheets

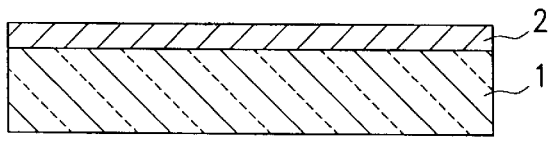
FIG. 1A
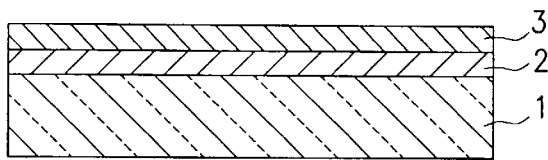
FIG. 1B
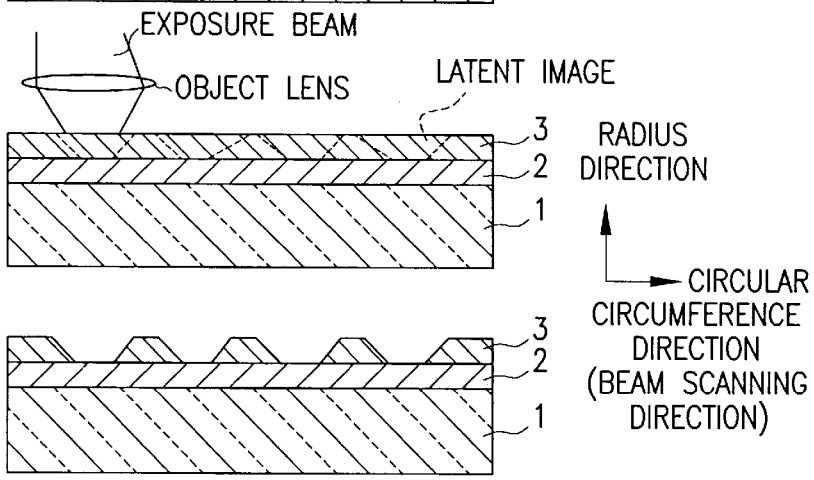
FIG. 1C
FIG. 1D
FIG. 1E
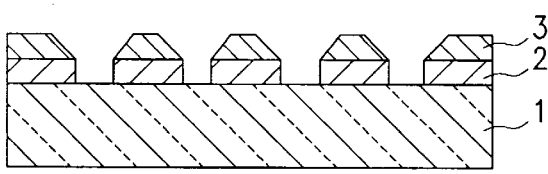
FIG. 1F
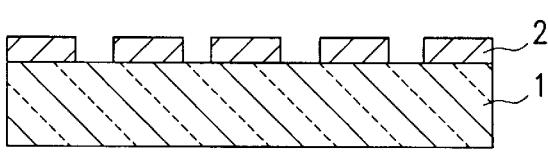
FIG. 1G
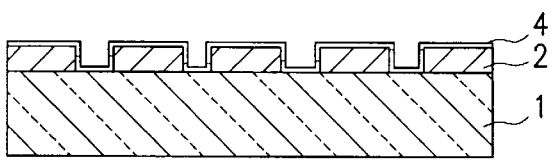
FIG. 1H
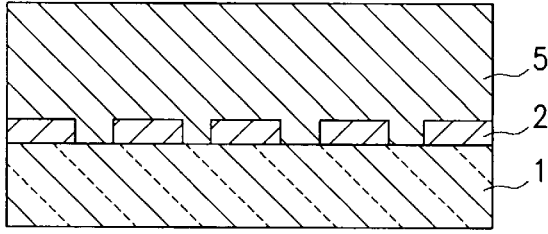
FIG. 1I
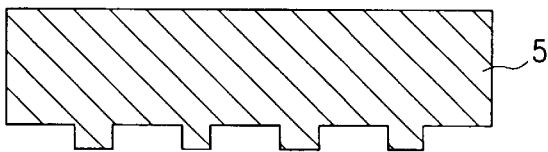

DISTANCE DIRECTION [μm]
RELATIONSHIP-3 BETWEEN EXPOSURE LIGHT INTENSITY AND GROOVE CROSS SECTION
(RESIST FILM THICKNESS; 1,500Å)

METHOD OF MANUFACTURING A STAMPER FOR USE IN OPTICAL INFORMATION RECORDING MEDIUM

BACKGROUND OF THE INVENTION

1. Field of the Invention

The present invention relates to a method of manufacturing a stamper for use with an optical information recording medium, and in particular, to a method of forming a a pattern in the stamper.

2. Discussion of the Background Art

Regarding a general photoresist, since the latent image is formed by the action of the bridge reaction and the thermal bridge reaction due to the exposure, the width of the groove at the opening portion (the length of the long side in the trapezoidal shape: $W_{top}$) turns out to be wider by approximately 10%–20% than the diameter of the beam spot. Furthermore, since the light intensity distribution of the focused beam is a Gaussian distribution, the groove formed on the photoresist becomes trapezoidal in shape. Refer to FIG. 6 and FIGS. 8–10.

The problem with a trapezoidal groove is that, when the track pitch is narrowed, the opening portion of the groove mutually interferes with the tracks adjacent thereto, and the height of the flat portion (land) between the grooves decreases, and thereby the depth of the groove cannot be controlled by the thickness of the photoresist film. Another problem is that the recording property of an optical information recording medium made by a stamper not having flat lands is deteriorated. The cross-talk signal from the adjacent tracks increases, in particular, and the jitter property is worsened.

For this reason, in a stamper for use with an optical information recording medium having narrow track pitch and large capacity, the width of the groove should be narrow and the shape of the groove cross section should be substantially rectangular. In order to narrow the groove to be formed on the photoresist, the wavelength of the exposing beam is preferably shortened and the numerical aperture (referred to hereinafter as "NA") of the opening portions of the object lens is preferably increased. However, since the rate of the focal point depth is decreased, there arises a fear that the shape of the groove varies. Therefore, it is necessary to realize a photolithograph technology in which a groove cross section finer than the exposing beam spot can be obtained even though the wavelength is not decreased and the NA is not increased.

Regarding the background art for forming a groove having a diameter not larger than the exposing beam spot, the following three methods have been adopted:

(1) a method of reinforcing (increasing) the contrast by use of a light decoloring resin;

(2) a method of decreasing the diameter of the beam spot by use of an ultra-resolution element; and (3) a method of etching the lower layer utilizing a resist mask pattern.

As a representative example of the aforementioned item (1), the published specification of Japanese Laid-open Patent Publication No. 7-287,874/1995 describes a method of manufacturing the master plate of an optical disc. In the technology, a light decoloring resin layer is formed on the photoresist, and the diameter of the practicing beam spot to be focused on the photolithographic resist by the photochromic effect can be decreased to the extent of ⅔–½.

As a representative example of the aforementioned item (2), the published specification of Japanese Laid-open Patent Publication No. 6-243, 511/1994 describes the method of making the master plate for use in the optical disc. In the technology, an ultra-resolution element is inserted into the optical path (light path), and thereby the diameter of the beam spot is reduced. Since the phenomenon of the sidelobe occurs due to the influence of the diffraction of the ultra-resolution element, the combination of the ultra-resolution element and the light decoloring resin is employed for coping with the above-mentioned phenomenon.

As a representative example of the aforementioned item (3), the published specification of Japanese Laid-open Patent Publication No. 9-106,584/1997 describes the method of manufacturing a recording master plate for use with an optical disc. In the technology, utilizing the fact that the shape of the cross section of the pattern to be formed on the photoresist, an intermediate layer formed under the resist is etched with the resist pattern serving as the mask. Furthermore, the lower layer is then etched with the intermediate layer serving as the mask. In such manner, it turns out to be possible to form a groove finer than the diameter of the beam spot (groove pattern of the resist) having the cross section almost vertical.

Regarding the background art as described in the item (1), the diameter of the beam spot focused on the surface of the photoresist can be reduced to almost 50% owing to the contrast reinforcing effect due to the light decoloring resin layer. However, the amount (intensity) of the light arriving at (transmitted through) the photoresist surface is lowered to approximately ¹⁄₁₀. This is a problem of the background art to be solved. Refer to items [0025] and [0027] on page 3 in the published specification of Japanese Laid-open Patent Publication No. 7-287,874/1995.

Here, in order to increase the light intensity of the exposing beam, it is necessary to prepare a large-size laser light source of high power. As the result, the operating cost of the laser increases. In addition, it is necessary to further increase the light intensity in order to raise the exposure straight line velocity (CLV) for shortening the time of exposing the master plate. On this occasion, there arises a problem of the shortage of the light intensity. That results in the limitation of the improvement in productivity.

Regarding the background art as described in item (2), the diameter of the exposing light beam is reduced by inserting the ultra-resolution element into the optical path. However, even in the ultra-resolution element, the light intensity is reduced to almost ½ due to the light loss. Refer to item (0018) on page 4 in the published specification of Japanese Laid-open Patent Publication No. 6-243,512/1994. In order to remove the influence of the sidelobe due to the ultra-resolution element, it is necessary to reinforce the contrast due to the light decoloring resin layer. This causes a further shortage of light intensity as compared with the above background art (1).

Regarding the background art as described in item (3), in the background method utilizing the photoresist layer or the intermediate layer as the mask (the method described in the published specification of Japanese Laid-open Patent Publication No. 106,584), the master plate is constructed with the three layers of etching material (lower layer)/$SiO_2$ (Intermediate layer)/photoresist (upper layer). The lower layer is etched with the intermediate layer as the mask layer and the groove pattern on the lower layer thus etched (etching layer) is used as d stamper.

In the method of forming the groove by use of a single-layer photoresist film, two more processes are added: a process of forming the films on the Intermediate layer and the lower layer and a process of etching the intermediate layer and the lower layer, the manufacturing yield for the product (stamper) is lowered due to the increase of the defects occurring in those processes. Furthermore, the cost of manufacturing the stamper is increased due to the increase of the processes thereof. Those are problems to be solved.

Furthermore, in the case of making the stamper by processing the lower layer surface having a groove formed thereon with the conductive film treatment and Ni-electroforming, it is necessary to remove the etching layer remaining on and attached to the surface of the stamper. In order to remove it, the same method as that of the method of etching the lower layer thereof is utilized. However, on this occasion, the surface of the stamper is damaged thereby and the noise level at the time of recording/reproducing increases. Those are problems to be solved.

SUMMARY OF THE INVENTION

The present invention alleviates to a great extent die above-mentioned problems. A first aspect of the present invention relates to a method of manufacturing a stamper for use in an optical information recording medium including the steps of: exposing a photoresist film on a glass base plate with a light beam and thereby forming a predetermined groove pattern; making a predetermined groove pattern from the photoresist film thus exposed as a glass master plate; forming an electrically conductive membrane on the surface of the glass master plate; treating the electrically conductive membrane with Ni-electroforming; and making thereby a nickel (Ni) plate having a groove pattern of concave/convex surfaces inverse to the groove pattern of the photoresist film, in which the method of manufacturing a stamper for use in an optical information recording medium further including the steps of; providing a water-soluble resin layer not reacting to the exposure and having a film thickness equal to the depth of the groove formed on the surface of the stamper between the glass base plate and the photoresist film; making a mask having a micro-pattern of the photoresist film; etching the water-soluble resin layer which is the lower layer and thereby forming the micropattern; and making a glass master plate having the micropattern thereafter, by removing the photoresist film.

A second aspect of the present invention relates to the method of manufacturing a stamper for use in an optical information recording medium in connection with the first aspect, in which the material of the water-soluble resin layer is a water-soluble resin selected from among polyvinyl alcohol, methyl cellulose, or polyvinyl pyrrolidone; and in which the water-soluble resin layers are etched at the same time, by developing solution at the time of forming the micropattern on the photoresist film in the case of the wet-type development, or by pure water at the time of cleaning a developing unit.

A third aspect of the present invention relates to the method of manufacturing a stamper for use with an optical information recording medium in connection with the first or second aspect, in which, prior to forming the water-soluble resin layer on the glass base plate, the surface of the glass base plate is treated with the cleaning process so as to make the surface thereof hydrophilic.

A fourth aspect of the present invention relates to the method of manufacturing a stamper for use in an optical information recording medium in connection with either one of the first through third aspects, in which, prior to applying the photoresist film on the water-soluble resin layer, the surface of the water-soluble resin layer is treated with silane coupling.

A fifth aspect of the present invention relates to the method of manufacturing a stamper for use in an optical information recording medium in connection with either one of the first through fourth aspects, in which the solvent for removing the photoresist film formed on the water-soluble resin layer is the solvent selected among the solvents such as isopropyl alcohol and acetone for diluting photoresist.

A sixth aspect of the present invention relates to the method of manufacturing a stamper for use in an optical information recording medium in connection with in either one of the first through fifth aspects, in which, after peeling off the Ni plate, when the water-soluble resin layer remaining on and attached to the surface of the Ni plate is removed and cleaned, pure water is used as the cleaning liquid.

A seventh aspect of the present invention relates to the method of exposing the master plate in manufacturing a stamper for use in an optical information recording medium in connection with either one of the first through sixth aspects, in which, when a predetermined groove pattern is formed on the photoresist film, in order to control the bottom width of the groove formed on the photoresist film where the water-soluble resin layer is exposed, the thickness of the photoresist film is made constant and the intensity of the light beam for exposing the photoresist film is changed.

An eighth aspect of the present invention relates to the method of exposing the master plate in manufacturing a stamper for use in an optical information recording medium in connection with either one of the first through sixth aspects, in which, when a predetermined groove pattern is formed on the photoresist film, in order to control the bottom width of the groove formed on the photoresist film where the water-soluble resin layer is exposed, the intensity of the light beam for exposing the photoresist film is made constant and the thickness of the photoresist film is changed.

It is an object of the present invention to provide a method of forming a groove having a diameter smaller than that of the beam of the exposing spot.

It is another object of the present invention to provide a method of uniformly forming the groove on the lower layer in the process of manufacturing a stamper.

It is still another object of the present invention to provide a method of uniformly forming the groove on the photoresist layer serving as the mask in the process of manufacturing the stamper.

It is still another object of the present invention to provide a method of uniformly removing the water-soluble resin layer remaining on and attaching to the surface of the stamper in the process of manufacturing the stamper without damaging the stamper.

It is still another object of the present invention to provide a method of controlling the width of the groove when the groove smaller than the diameter of the beam of the exposing spot is formed in the process of manufacturing the stamper.

BRIEF DESCRIPTION OF THE DRAWINGS

A more complete appreciation of the invention and many of the attendant advantages and aspects thereof will be readily obtained as the same becomes better understood by reference to the following detailed description when considered in connection with the accompanying drawings, wherein:

FIGS. 1A through 1I are explanatory diagrams for explaining the processes of manufacturing the stamper for use in the optical disc according to the present invention;

PREFERRED EMBODIMENT OF THE PRESENT INVENTION

Figure 2:
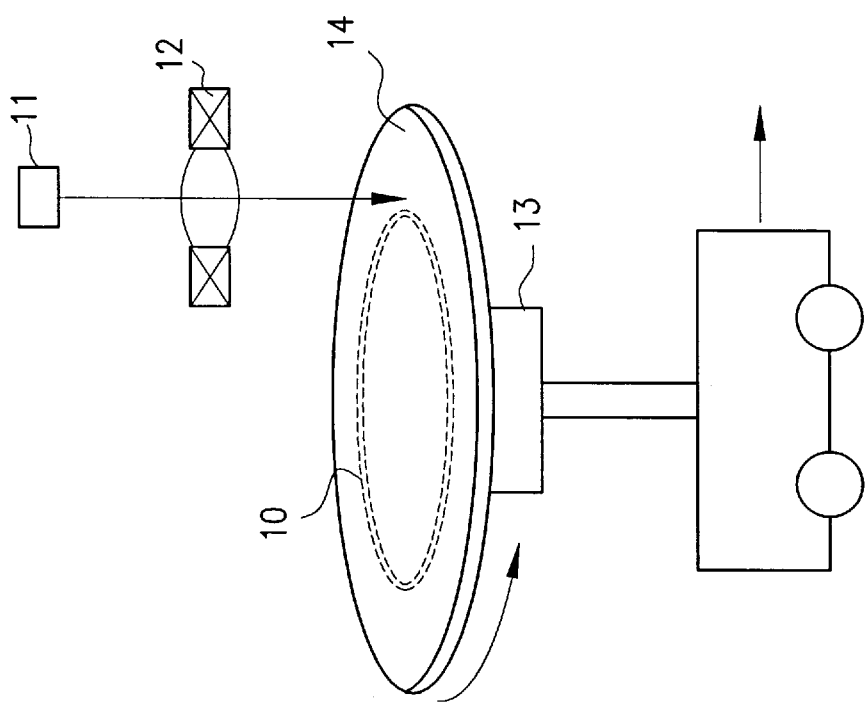
FIG. 2 is an explanatory diagram for explaining the method of exposing the master plate.

The process of manufacturing the stamper for use in the optical disc according to the present invention is described hereinafter, referring to FIG. 1.

Process 1—Base Plate Cleaning

The cleaning/drying process for the base plate is done in order to remove dust attached to the base plate with ultra-pure water. The process is not discussed in detail herein.

Process 2—Surface Cleaning

Organic matter (compound) attached onto the surface of the glass base plate is removed with an ozone treatment and oxide film is formed on the surface thereof in order to improve the easiness of applying the water-soluble resin layer onto the glass base plate. Owing to the effect thereof, the wettability (hydrophile property) of the water-soluble resin to the glass base plate can be improved and the thickness of the water-soluble resin film can be made more uniform. In addition, the adhesion (property) of the water-soluble resin to the glass base plate can be strengthened. The process is not shown in FIG. 1.

Processing 3—Lower Layer Application

As shown in FIG. 1A, a water-soluble resin is spin-coated on the surface-treated glass base plate 1, and the base plate thus treated is heated, dried, and thereafter cooled. At this time, it is necessary to apply the resin film 2 thereto such that the thickness of the lower layer film 2 is equal to the depth of the groove to be formed on the surface of the stamper.

Process 4—Pre-treatment

The silane coupling treatment is done, namely, HMDS (hexamethyldisilazane) is spin-coated on the lower layer 2 formed in the process 3 on the surface-treated glass base plate 1, and the base plate thus treated is dried with high rotation speed, for the purpose of raising, or increasing, the close adherence force between the lower layer 2 and the photoresist 3. The process is not shown in FIG. 1.

Process 5—Masking Layer (Photoresist) Applying

Referring now to FIG. 1B, the photoresist is spin-coated on the surface of the lower layer 2 HMDS-treated in the process 4, and the surface thus treated is heated, dried, and thereafter cooled.

Process 6—Exposing of the Master Plate

The master plate manufactured in the process 5 is exposed with the Kr gas laser. The outline of exposing the master plate is illustrated in FIG. 2. The resist master plate 14 is rotated and transversely conveyed by the turntable 13 and the plate 14 is exposed with the exposing beam 11. Thereby, a spiral-state latent image is formed on the photoresist master plate as shown in FIG. 1C.

Process 7—Development/Rinse

The exposed master plate is developed. The exposed portion thereof, that is, the portion having latent image formed thereon, is removed. Then the master plate is rinsed by pure water and rotatively dried. Refer to FIG. 1D. At this time, the photoresist layer 3 serves as the mask layer at the time of the development. When the micropattern is formed on the aforementioned photoresist layer utilizing a wet-type development, the water-soluble resin layer 2 on the lower layer is etched at the same time with the above-mentioned development liquid. Otherwise, the water-soluble resin layer may be etched at the same time with the pure water during the pure water cleaning after the wet-type development process. The width of the groove formed on the lower layer is determined in accordance with the value of the bottom width ($W_{bot}$) of the trapezoid shape of the mask layer as shown in FIG. 1E.

Process 8—Mask Layer Removal

The mask layer 3 (photoresist layer) is removed by use of a solvent and the mask-removed portion is dried with high-speed rotation. Regarding the above solvent, it is necessary to select a solvent that does not dissolve the watersoluble resin in the lower layer 2. Refer to FIG. 1F.

Process 9—Conductive Film Treatment

The nickel film is formed by the sputtering on the surface of the master plate having the groove pattern formed in the process 8 as shown in FIG. 1G.

Process 10—Ni-electroforming

Nickel is laminated on the master plate having the conductive film formed in the process 9 utilizing the method of the Ni-electroforming as shown in FIG. 1H.

Process 11—Stamper Formation

The plate treated with the Ni-electroforming in the process 10 is peeled off from the glass master plate. The rear surface of the plate treated with the Ni-electroforming (surface not formed thereon with the groove pattern) is polished and any lower layer film 2 (water-soluble resin film) remaining on the surface of the groove pattern is cleaned with pure water. Thereafter the plate is rotated with high speed and dried. The inner and outer diameters are then respectively adjusted to the desired sizes by press (mechanical) processing. Refer to FIG. 1I. In such way as mentioned heretofore the processes I through 11 can be completed.

The differences between the background-art process of manufacturing the stamper as shown in FIG. 10 and the process of manufacturing the same according to the present invention are described below. In FIG. 10, like reference numerals refer to like elements as discussed above in connection with the present invention.

The present invention differs from the background art in that the water-soluble resin layer 2 is provided between the glass base plate 1 and the photoresist layer 3 according to the present invention. In the background art, the groove pattern formed on the photoresist layer is employed as the stamper, while, in the present invention, the groove pattern formed on the photoresist layer is utilized as the mask layer and the groove pattern on the lower layer 2 is employed as the stamper.

As the result, since the bottom width of the groove becomes equal to the groove width of the lower layer 2, it is possible to form a groove finer (smaller) than the groove cross section formed on the photoresist on the lower layer. Furthermore, it is also possible to obtain a groove pattern having a substantially rectangular cross section instead of a groove pattern having a trapezoid cross section.

Figure 9:
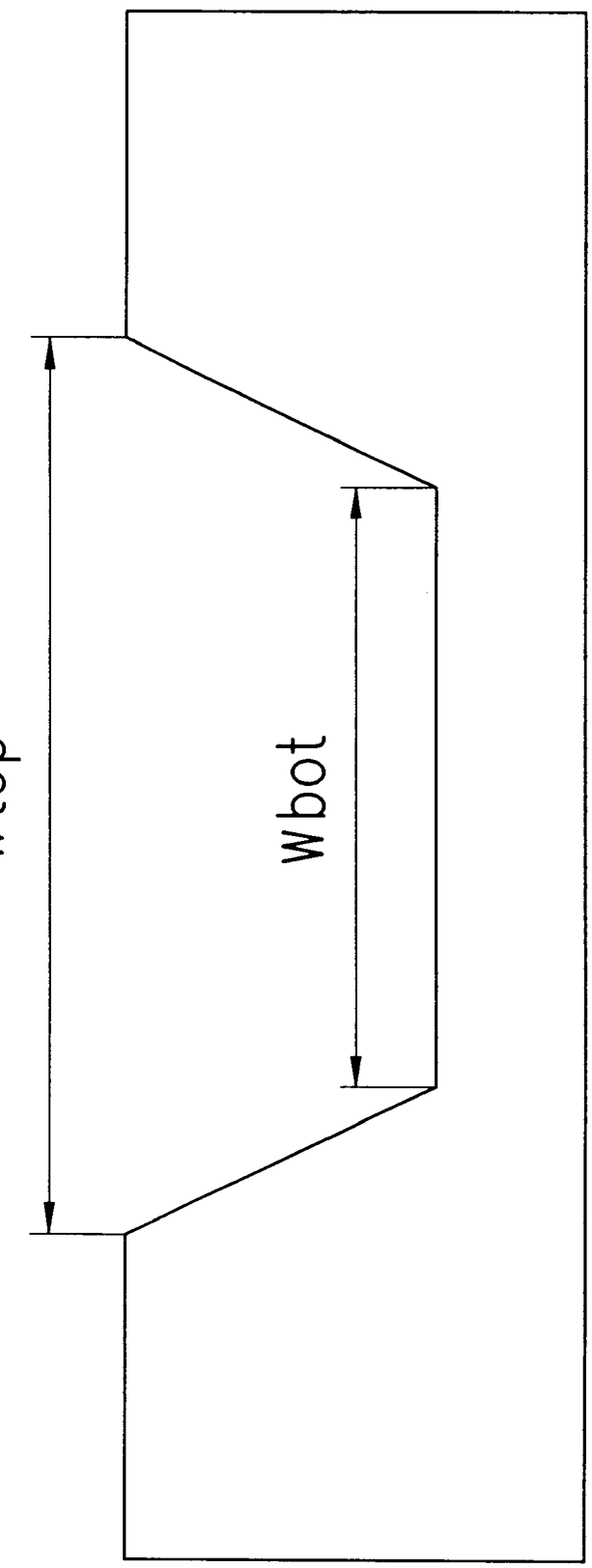
FIG. 9 is a cross-sectional view showing the shape of the cross section of the groove manufactured in accordance with a background art method.
Figure 10A:
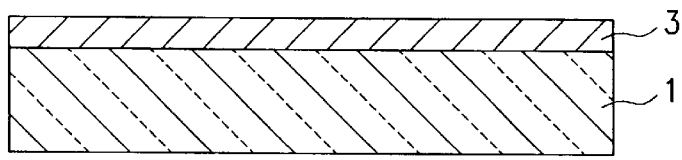
FIGS. 10A through 10F are explanatory diagrams for explaining the processes of manufacturing the stamper for use in the optical disc according to the background art.
Figure 10B:
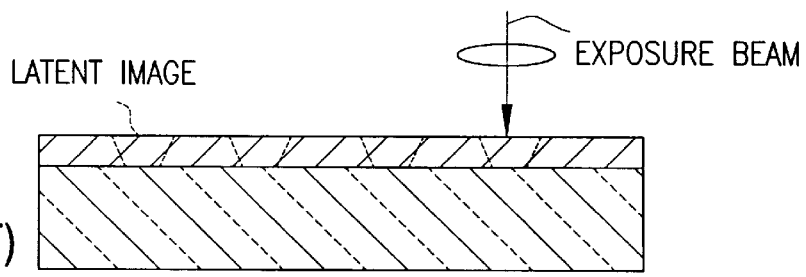
Figure 10C:
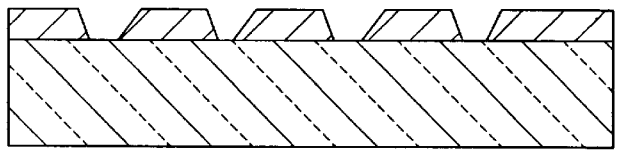
Figure 10D:
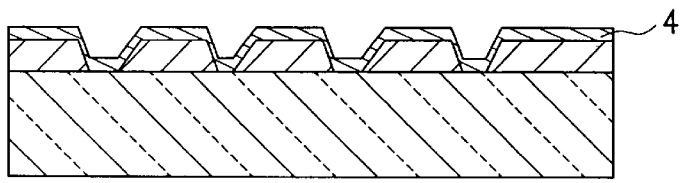
Figure 10E:
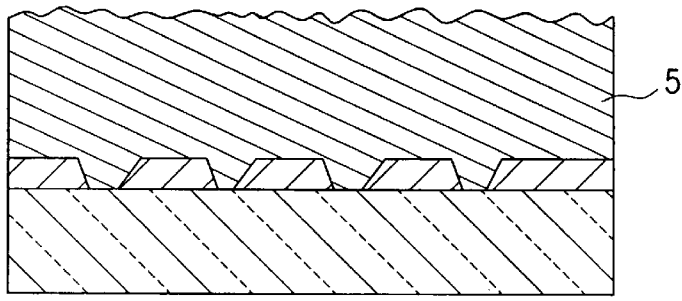
Figure 10F:
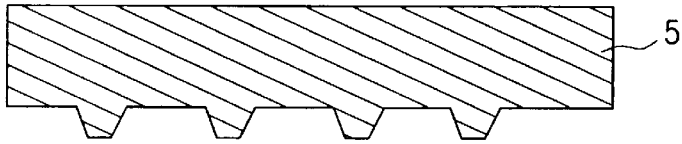

The cross section of the groove formed on the photoresist layer 3 by the background art process is trapezoid as shown in FIG. 9. The reason for this is that the light intensity distribution of the beam spot is the Gaussian distribution and the portion of the foot (lower slopes) of the Gaussian distribution exerts an influence upon the inclination of the groove cross section.

Figure 4:
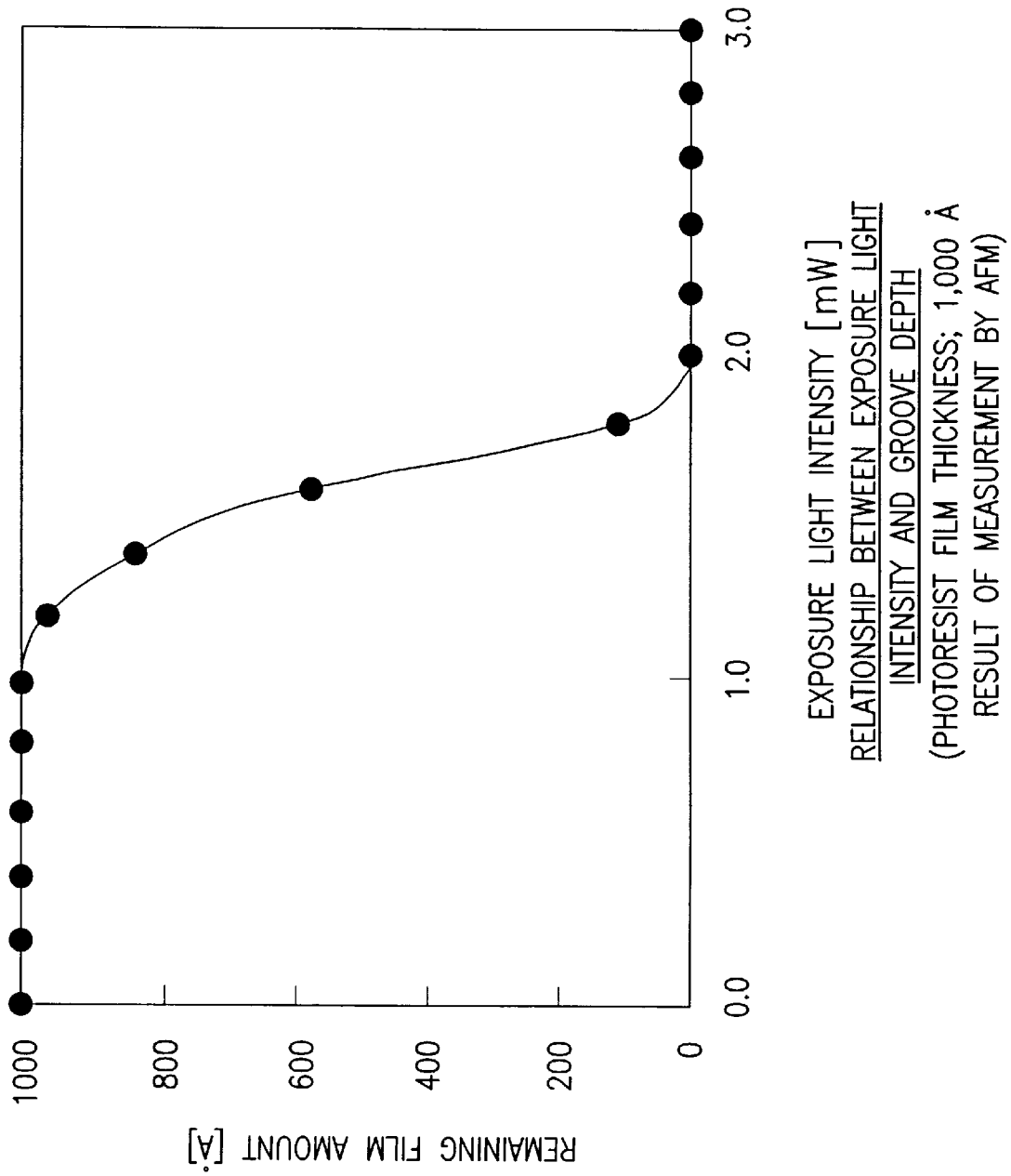
FIG. 4 is a graph illustrating the relationship between the exposure light amount (intensity) and the depth of the formed groove.
Figure 5:
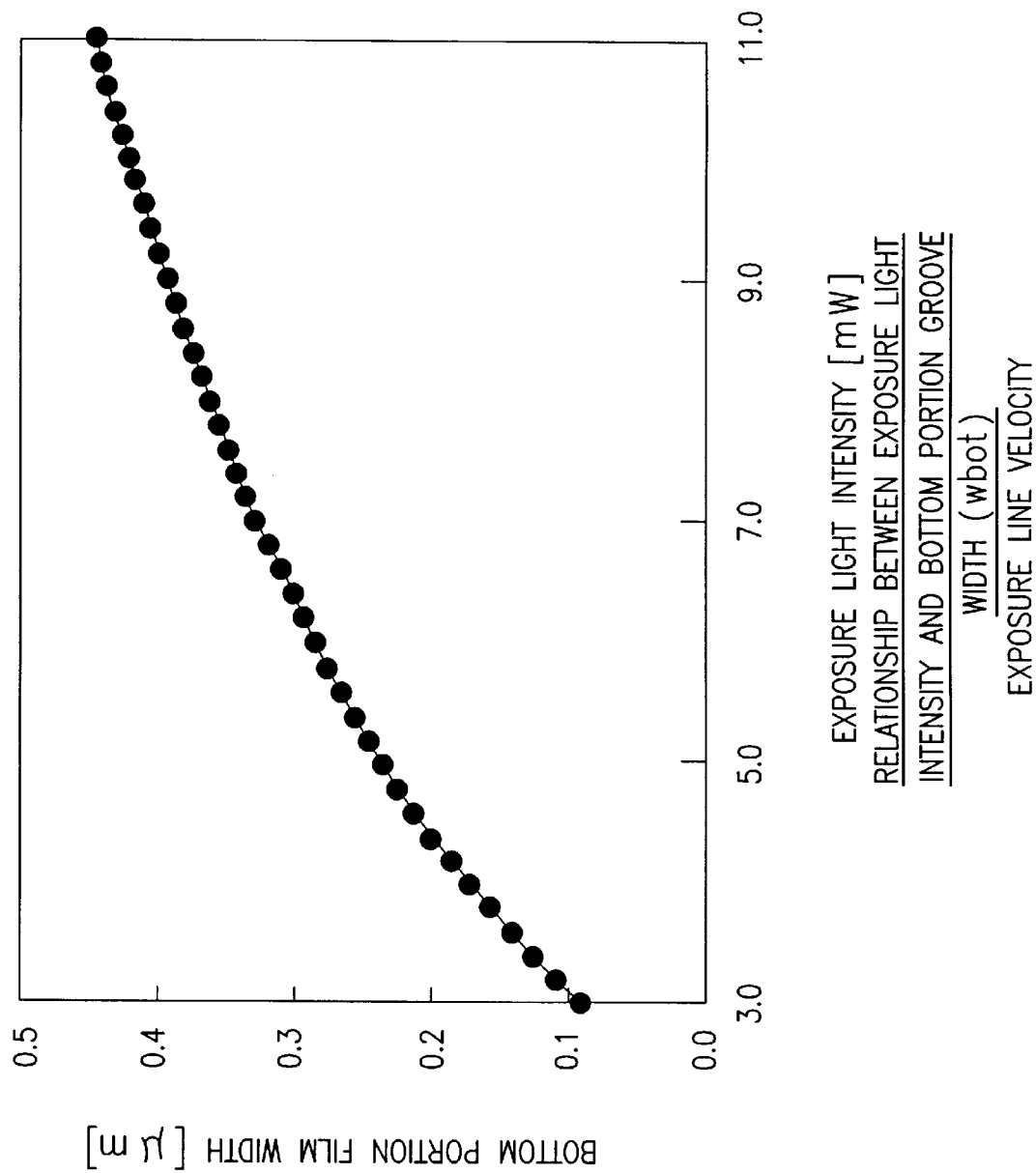
FIG. 5 is a graph illustrating the relationship between the exposure light amount (intensity) and the bottom groove width ($W_{bot}$) of the manufactured groove.
Figure 6:
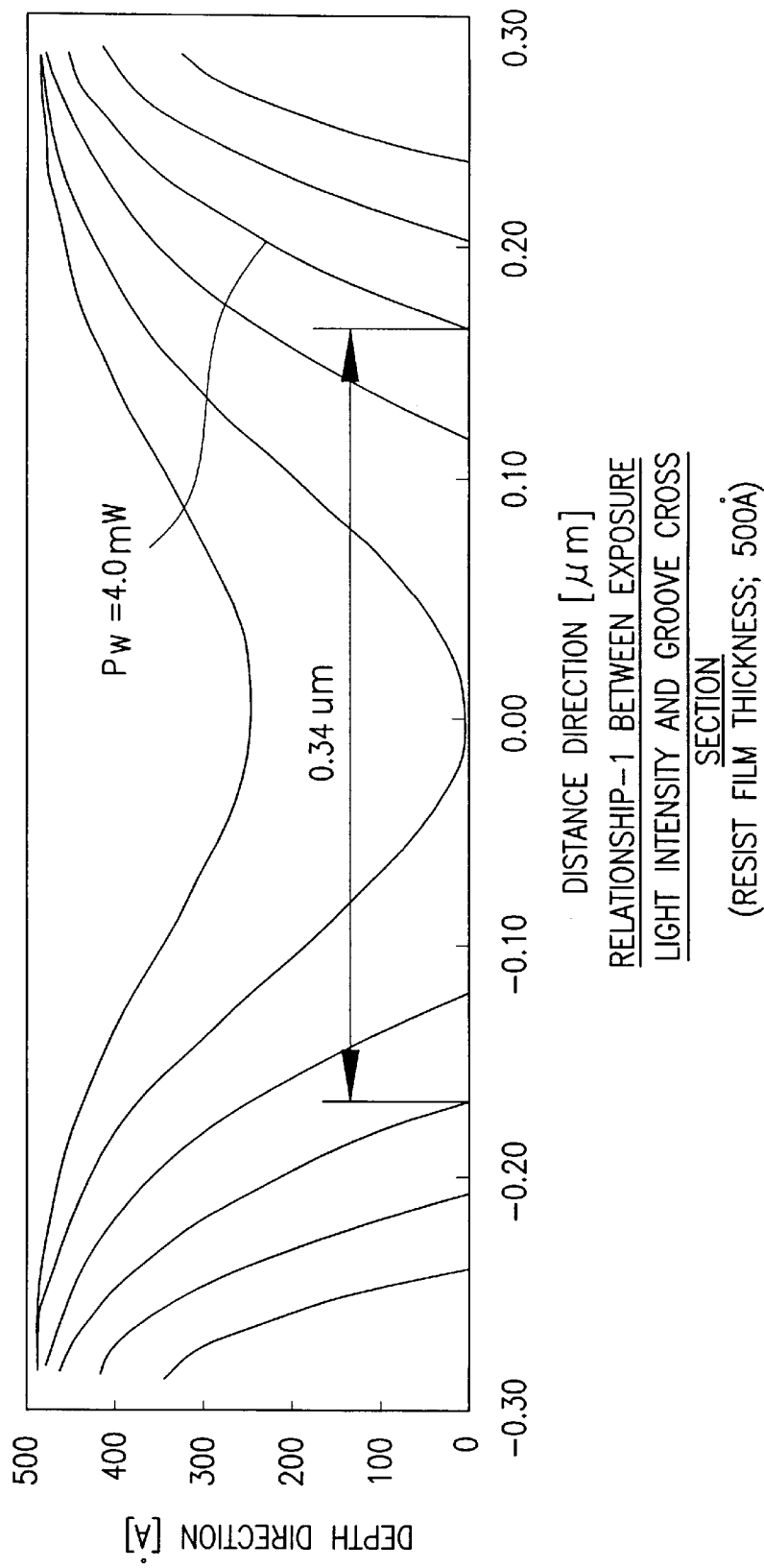
FIG. 6 is a graph illustrating the relationship between the exposure light amount (intensity) and the groove cross section when the thickness of the resist film is 500 Å.
Figure 7:
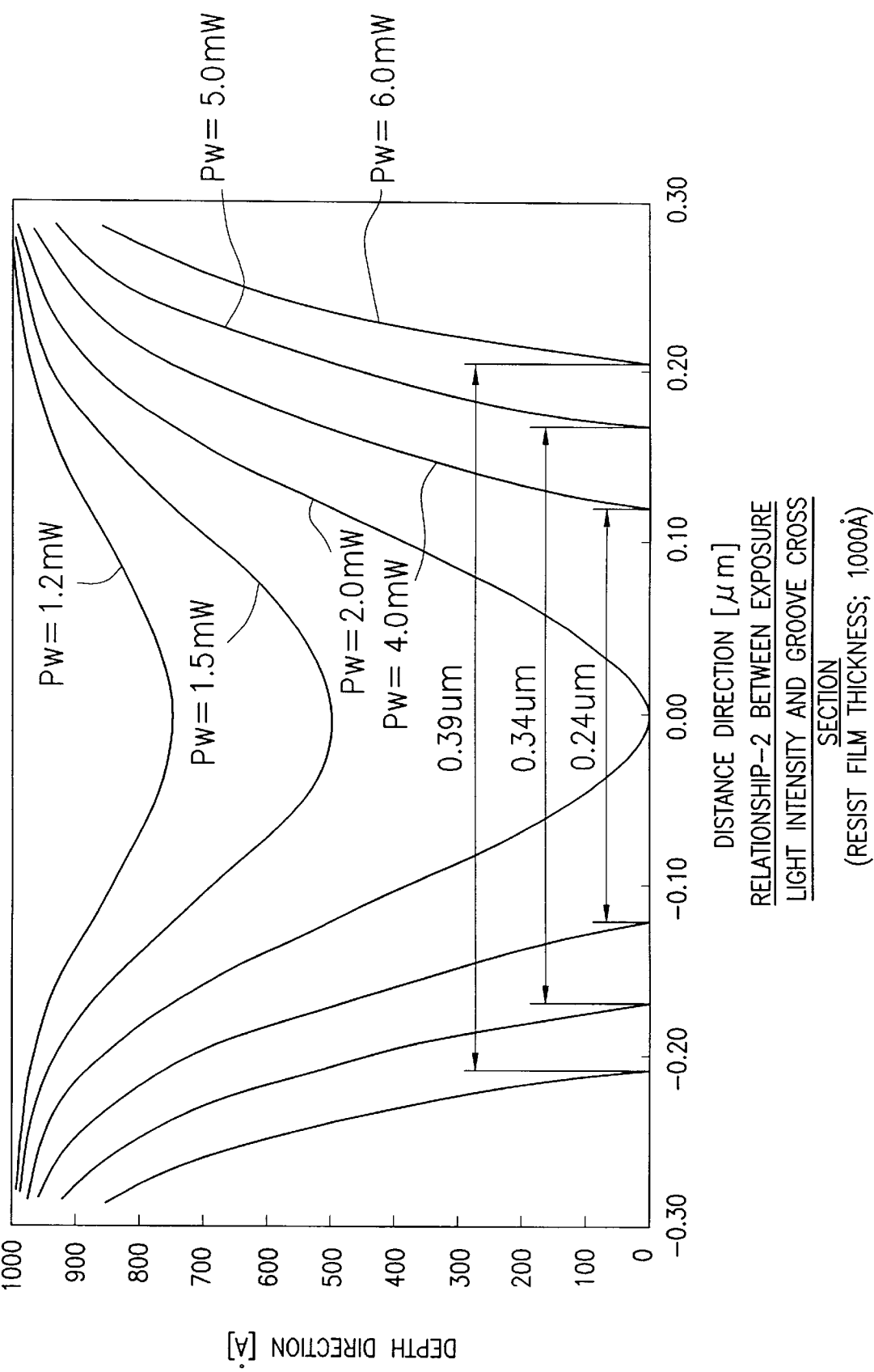
FIG. 7 is a graph illustrating the relationship between the exposure light amount (intensity) and the groove cross section when the thickness of the resist film is 1,000 Å.
Figure 8:
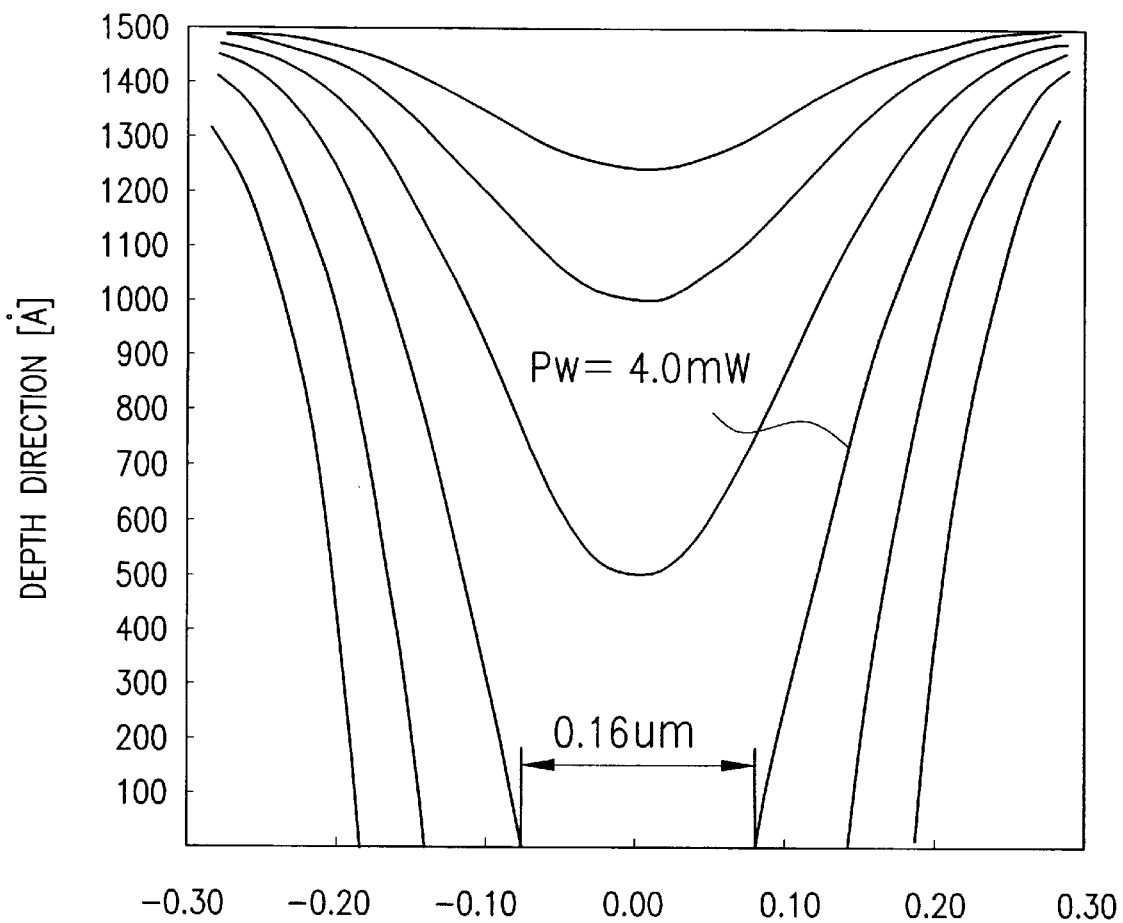
FIG. 8 is d graph illustrating the relationship between the exposure light amount (intensity) and the groove cross section when the thickness of the resist film is 1,500 Å.

Regarding the relationship between the exposure light intensity and the groove depth in case that the thickness of the photoresist film is 1,000 Å, as is apparent from FIG. 4 showing the measurement result by the AFM and FIGS. 6 through 8 showing the relationships between the exposure light intensity and the square measure of the groove cross section in respective cases that the resist film thicknesses are 500 Å, 1,000 Å, and 1,500 Å, when the exposure light intensity is low (namely, when the groove depth is smaller than the thickness of the photoresist film), the groove cross section turns out to be of the shape of a Gaussian distribution. Furthermore, when the exposure light intensity is increased, the groove cross section is changed to be of the shape of a trapezoid. The more the exposure light intensity becomes, the wider the bottom width ($W_{bot}$) becomes. Furthermore, even though the thickness of the mask layer film is adjusted on the condition of the constant exposure light intensity, it is possible to control the bottom width formed on the mask layer. The bottom width can be adjusted utilizing those two methods, and the groove width of the lower layer can be controlled. As shown in those figures, the bottom width $W_{box}$ becomes smaller (narrower) than the diameter of the focused light beam.

Utilizing the principle as mentioned heretofore, in the present invention, the groove width of $W_{bot}$ is controlled and that results in enabling to form the groove narrower than the spot diameter of the exposing light beam on the lower layer. Furthermore, since the water-soluble resin is employed as the lower layer material, the lower layer can be simply etched at the time of the development and rinse. In addition, the troublesome lower layer etching process becomes unnecessary, and thereby the number of the processes does not increase. Still furthermore, in the process of cleaning the stamper after the operation of peeling-off, the lower layer (water-soluble resin) remaining on and attached to the stamper can be simply removed by water-cleaning, and the surface of the stamper is not damaged at all at the time of removing and cleaning the remaining attachments. The above-mentioned matters are the merits of the present Invention.

The method of manufacturing the stamper according to the present invention is described hereinafter in further detail.

(1) Method of making Master Plate

The polished glass master plate (disc-state) is surface-treated for about three minutes by use of an ozone treatment apparatus called UV/O3. Other methods for improving the wettability (hydrophile property) of the surface for water can be substituted for the ozone treatment method. For instance, when the surface thereof is cleaned (the organic substance is removed) with a solvent such as isopropyl alcohol, etc., and thereafter the surface is sufficiently cleaned with pure water, the surface of glass can be replaced (substituted) for the hydrophilic surface. However, the ozone treatment method is a superior method in consideration of the superior property of removing the organic substance without the necessity of drying the glass master plate in the dry-type apparatus.

The water-soluble resin (lower layer) 2 is applied onto the glass master plate by use of the spin coater and a heating treatment is performed for the master plate, in the open state, at 130° C. and for 30 min. As the water-soluble resin material, for instance, TPF (main component thereof: polyvinyl alcohol) made by Tokyo Ohka Co., Ltd. is employed, and the film thickness of the lower layer 2 is adjusted to almost 600 Å. The film thickness of the lower layer is set to the same value as that of the depth of the groove pattern formed on the stamper. Owing to the heating treatment, the waterproofness (water-resisting qualities) of the water-soluble resin can be raised (increased), and thereby the peeling-off of the lower layer due to the side etching in the development/rinse process mentioned later can be prevented. Consequently, the quality of the groove shape formed on the lower layer can be stabilized. In the case of employing polyvinyl alcohol, utilizing the water-soluble property of high saponification value becoming lowered, it is possible to control the dissolving speed for water in the development/rinse process mentioned later. The saponification signifies dividing ester into alcohol, acid, and its salt by the action of the hydrolysis. Here, it may be allowable to use methyl cellulose or polyvinyl pyrrolidone as the water-soluble resin material, instead of polyvinyl alcohol.

After cooling the base plate to the room (ambient) temperature, the base plate is spin-coated with HMDS (hexamethyldisilazane) and dried completely. The HMDS treatment (silane coupling treatment) is practiced for the purpose of making the surface of the lower layer hydrophobic. Under such treatment, the photoresist 3 can be uniformly applied onto the surface of the lower layer, and the close adhesion force between the lower layer 2 and the photoresist layer 3 can be raised. In such way, the above treatment performs the role of preventing the peeling-off of the photoresist at the time of the development.

The photoresist (mask layer) is applied onto the lower layer by use of the spin coater, and the heating treatment is practiced for the lower layer thus treated in the open state at 90° C. for 30 min. As to the material for the photoresist, for instance, a positive-type i-line-shaped resist made by Tokyo Ohka Co., Ltd. is employed. The film thickness of the mask layer is adjusted to almost 1,000 Å. The temperature of the heating treatment needs to be set to a temperature lower than the temperature at the time of forming the lower layer. The reason therefor is that, if the temperature is set to a temperature higher than that, the pin-hole defect occurs on the surface of the photoresist due to the remaining (residual) gas emitted from the lower layer 2.

(2) Exposure of Master Plate

Figure 3:
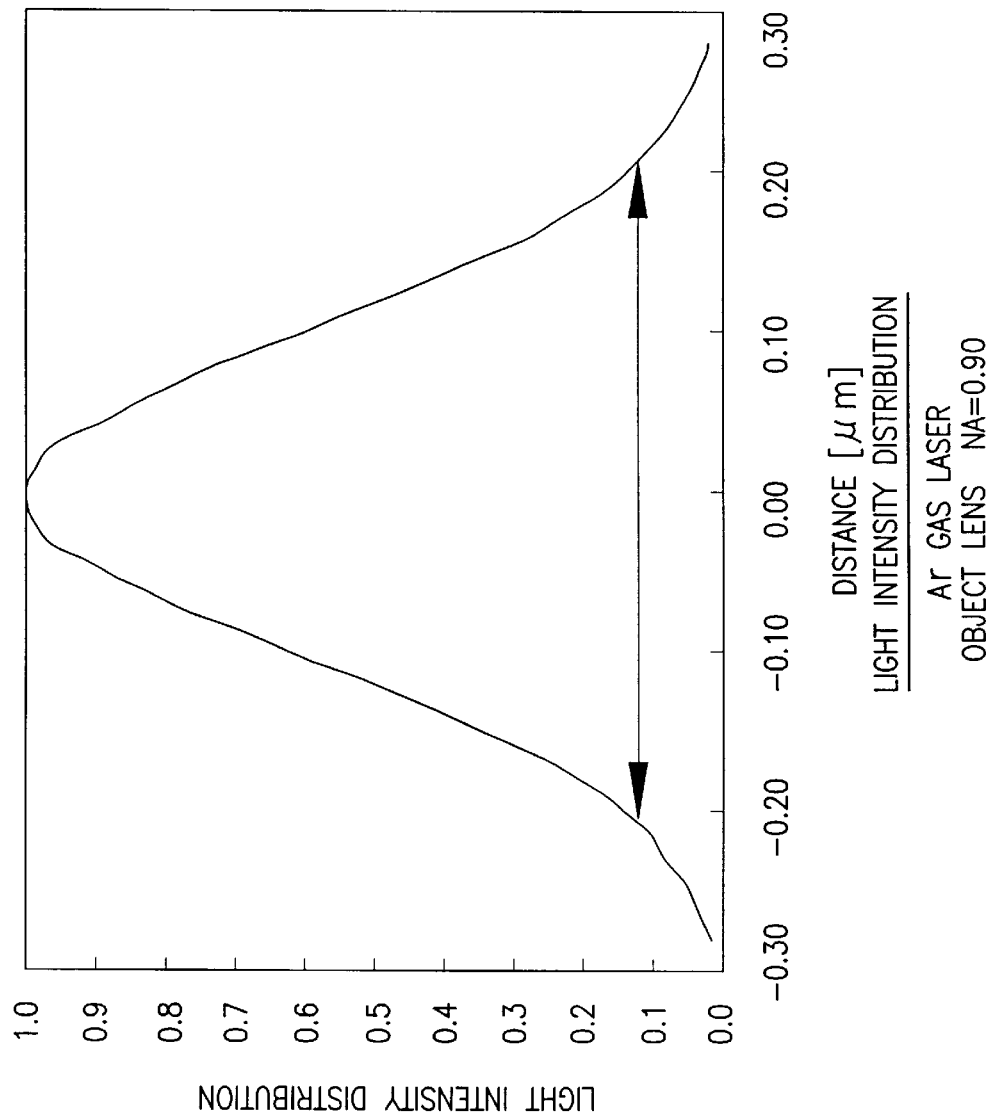
FIG. 3 is a graph illustrating the light intensity distribution of the exposure light beam for use in exposing the master plate.

FIG. 3 shows the light intensity distribution of the exposure light beam (spot shape). In FIG. 3, the laser wavelength is 413 μm when the I( gas laser is used, and the numerical aperture NA of the openings of the object lens is as follows:

NA=0.90

At this time, the beam diameter of 1/e2 is almost 0.4 μm. The master plate is exposed utilizing the method of exposing the original plate as shown in FIG. 2. Alternatively, the master plate may be exposed by the CLV method (line speed; constant) and the line speed is 7.2 m/s.

As is apparent from the graph shown in FIG. 7 for illustrating the relationship between the exposure light intensity and the square measure of the groove cross section in the case of the resist film thickness; 1,000 Å, the bottom width ($W_{box}$) of the groove formed on the mask layer can be controlled by adjusting the exposure light intensity.

Furthermore, as is apparent from the graph shown in FIG. 7 for illustrating the relationship between the exposure light intensity (Pw) and the bottom width ($W_{box}$) of the groove in case that i-line-shaped photoresist is employed, exposure line speed VI is equal to 7.2 m/s, and the thickness of the resist film is 1,000 Å, the respective relationships between the exposure light intensity Pw and the bottom width $W_{bot}$ of the groove are as follows:

$$W_{bot}=0.24 \mu m, \text{ at Pw=4 mW;}$$

$$W_{bot}=0.34 \mu m, \text{ at Pw=5 mW;}$$

and $$W_{bot}=0.39 \mu m, \text{ at Pw=6 mW.}$$

The bottom width ($W_{bot}$) of the groove formed on the mask layer can be also controlled by adjusting the film thickness of the mask layer (photoresist layer) on the condition that the exposure light intensity is constant.

As is apparent from the graphs shown in FIGS. 6 through 8, when the exposure light intensity Pw is fixed to 4 mW, the respective relationships between the film thickness t of the mask layer and the bottom width $W_{bot}$ of the groove are as follows:

$$W_{bot}=0.34 \mu m, \text{ at t=500 Å;}$$

$$W_{bot}=0.24 \mu m, \text{ at t=1,000 Å;}$$

and $$W_{bot}=0.16 \mu m, \text{ at t=1.500 Å.}$$

(3) Development/Rinse

The master plate thus exposed is developed with alkaline developer (developing agent), rinsed with pure water, and swingingly dried with high rotation speed. By practicing such development process, a latent image 10 formed by the exposure process is removed, and thereby the mask layer is formed. Thereafter, when the process of the development/rinse proceeds, the etching process of the lower layer 2 is started, and thereby a rectangular groove having the same groove width as $W_{bot}$ can be formed on the lower layer.

The lower the temperature of the pure water becomes, the slower the dissolving speed of the water-soluble resin. Utilizing such property, the temperature of the pure water used in the rinse process is adjusted, and thereby it is possible to control the dissolving speed for the (pure) water.

In such a situation, if the (liquid) temperature of the rinsing liquid is set to a constant temperature (comparatively low temperature; 5–15° C.), the variation rate of the groove shape for the rinsing time can be made small. As the result, the variation in the shape of the groove formed on the lower layer (difference in the same sample, or difference between the different samples) can be made small. Consequently, the quality of the groove shape can be stabilized.

The mask layer (photoresist) 3 is dissolved with isopropyl alcohol and removed from the master plate. The master plate thus treated is swingingly dried with high speed. Here, it may be allowable to use (paint) thinner or acetone both employed for the purpose of diluting or rinsing the photoresist as the solvent for removing the mask layer.

In order to enhance (raise) the waterproofness of the lower layer 2, the heating treatment is preferably further continued to practice at a high temperature; 100° C. or higher temperature. Owing to the heating treatment, the time-elapsing deformation of the lower layer due to the humidity absorption can be suppressed.

(4) Conductive Film Treatment

Nickel film of a thickness 500–1,000 Å is formed on the surface of the lower layer 2. The nickel film 4 serves as the electrode at the time of practicing the electroforming.

(5) Electroforming

A nickel plate 5 is made by piling (laminating) nickel on the surface of the lower layer 2 by the electroforming until the thickness thereof becomes equal to almost 300 $\mu m$.

(6) Stamper Peeling of Cleaning

The nickel plate 5 obtained in the previous (preceding) processes is peeled off from the glass base plate 1.

Thereafter, the lower layer (water-soluble resin) remaining on and attached to the surface of the nickel plate 5 is cleaned and removed, and the surface thereof is dried. Here, it may be also allowable that, when the remaining attachments cannot be sufficiently removed, hot water is used, utilizing the property of increasing the extent of the dissolving speed of the water-soluble resin.

(7) Rear Surface Polishing

A protection film is applied onto the groove forming surface by way of the plastics coating, and then, the rear surface polishing is practiced. Here, it may be allowable to practice the rear surface polishing before the process of stamper peeling-off/cleaning. On this occasion, it is not necessary to apply the protection film to the groove forming surface.

(8) Inner and Outer Diameters Mechanical Processing

The stamper is cut such that the inner and outer diameters of the stamper respectively become equal to the desired sizes. In such way, the stamper can be completed.

(9) Electroforming Duplication

It is also possible that the stamper made in the foregoing processes is treated as a master and a plurality of replica stampers can be also made by the method of the electroforming reproduction.

A peeling-off film (oxide film) is formed on the surface of the master stamper, and the step of the electroforming/peeling-off is practiced so as to form the groove pattern on the master stamper. In such way, a mother stamper having the concave/convex surfaces different from (inversed to) those of the master stamper can be made. It is possible to make (transfer) plural mother stampers from the one (single) master stamper.

Furthermore, the pealing-off film is formed in the same way on the mother stamper, and the steps of the electroforming/peeling- off are practiced for the mother stamper. Thereby, the plural son stampers having the same concave/convex surfaces as that of the mother stamper can be made. In such way as mentioned above, since the plural son stampers (replica stampers) can be made (duplicated), it is not necessary to expose the stampers one by one, and thereby the mass production of the stampers can be made possible.

As to the method of forming the oxide film, it is possible to form it, utilizing a wet-type method employing potassium bichromate or a dry-type method of the aforementioned ozone treatment.

As is apparent from the foregoing description of the present invention, it is possible to find numerous advantageous functional effects overcoming the background arts.

According to a first aspect of the present invention, since the photoresist layer is used as the mask layer and the groove is formed by etching the lower layer thereof, it is possible to form the groove smaller than the beam diameter of the exposing beam spot on the lower layer.

According to a second aspect of the present invention, since the water-soluble resin is used as the material for the lower layer, when the photoresist layer is developed and cleaned, the lower layer can be treated with the etching process at the same time.

According to a third aspect of the present invention, since the surface of the glass base plate is treated such that the treated surface has the hydrophile property, the wettability of the water-soluble resin for the glass surface can be improved and thereby the water-soluble resin film can be uniformly applied onto the glass base plate.

According to a fourth aspect of the present invention, since the surface of the lower layer is treated with the silane coupling, the wattability of the photoresist for the surface of the lower layer can be improved and thereby the photoresist film can be uniformly applied.

According to a fifth aspect of the present invention, since the solvent capable of selectively removing only the photoresist layer is employed, the groove pattern of the lower layer is not damaged at all and only the photoresist layer can be uniformly removed.

According to a sixth aspect of the present invention, since the water-soluble resin is employed on the lower layer, the lower layer remaining on and attached to the surface of the stamper can be dissolved only by cleaning with pure water. In addition, the surface of the stamper is not damaged at all and the lower layer remaining on and attached to the surface of the stamper can be uniformly removed.

According to a seventh aspect of the present invention, since the photoresist layer is employed as the mask layer and the groove is formed by etching the lower layer, the width of the groove formed on the lower layer can be controlled by making constant the thickness of the photoresist layer film and by changing the light amount (intensity) of the exposure beam for exposing the photoresist layer.

According to an eighth aspect of the present invention, since the photoresist layer is employed as the mask layer and the groove is formed by etching the lower layer, the width of the groove formed on the lower layer can be controlled by making constant the light amount (intensity) of the exposure beam for exposing the photoresist layer and by changing the thickness of the photoresist layer film.

Obviously, other numerous embodiments or numerous modifications (variations) of the present invention are possible in light of the above teachings. It is therefore to be understood that, within the scope of the appended claims, the invention may be practiced otherwise than as specifically described herein.

Having now fully described the invention, it will be apparent to one of ordinary skill in the art that many changes and modifications can be made thereto without departing from the spirit and scope of the invention as set forth herein. This application is based on Japanese Patent Application No. JPAP10-095-779, filed on Apr. 8, 1998, the entire content of which is herein incorporated by reference.

I claim:

1. A method of manufacturing a stamper for use in an optical information recording medium comprising the steps of:

exposing a photoresist film on a glass base plate with a light beam and thereby forming a predetermined groove pattern;

making a predetermined groove pattern from said photoresist film thus exposed as a glass master plate;

forming an electrically conductive membrane on the surface of said glass master plate;

treating said electrically conductive membrane with Ni-electroforming; and making thereby a Ni plate having a groove pattern of concave/convex surfaces inverse to the groove pattern of said photoresist film, wherein said method of manufacturing a stamper for use in an optical information recording medium further comprises the steps of:

providing a water-soluble resin layer not reacting to the exposure and having a film thickness equal to the depth of the groove formed on the surface of the stamper between said glass base plate and said photoresist film;

making a mask having a micropattern of said photoresist film;

etching said water-soluble resin layer which is the lower layer and thereby forming said micropattern; and making a glass master plate having said micropattern thereafter, by removing said photoresist film.

2. The method of manufacturing a stamper for use in an optical information recording medium as defined in claim 1, wherein the material of said water-soluble resin layer is the water-soluble resin selected among polyvinyl alcohol, methyl cellulose, or polyvinyl pyrrolidone, and said water-soluble resin layers are etched at the same time, by developing solution at the time of forming the micropattern on said photoresist film in the case of the wet development, or by pure water at the time of cleaning.

3. The method of manufacturing a stamper for use in an optical information recording medium as defined in claim 1, wherein, prior to forming said water-soluble resin layer on said glass base plate, the surface of said glass base plate is treated with a cleaning process so as to make the surface thereof hydrophilic.

4. The method of manufacturing a stamper for use in an optical information recording medium as defined in claim 2, wherein, prior to forming said water-soluble resin layer on said glass base plate, the surface of said glass base plate is treated with a cleaning process so as to make the surface thereof hydrophilic.

5. The method of manufacturing a stamper for use in an optical information recording medium as defined in claim 1, wherein, prior to applying said photoresist film on said water-soluble resin layer, the surface of said water-soluble resin layer is treated with silane coupling.

6. The method of manufacturing a stamper for use in an optical information recording medium as defined in claim 2, wherein, prior to applying said photoresist film on said water-soluble resin layer, the surface of said water-soluble resin layer is treated with silane coupling.

7. The method of manufacturing a stamper for use in a optical information recording medium as defined in claim 3, wherein, prior to applying said photoresist film on said water-soluble resin layer, the surface of said water-soluble resin layer is treated with silane coupling.

8. The method of manufacturing a stamper for use in an optical information recording medium as defined in claim 4, wherein, prior to applying said photoresist film on said water-soluble resin layer, the surface of said water-soluble resin layer is treated with silane coupling.

9. The method of manufacturing a stamper for use in an optical information recording medium as defined in claim 1, wherein a solvent for removing said photoresist film formed on said water-soluble resin layer is the solvent selected among the dissolvents for diluting isopropyl alcohol, acetone, or photoresist.

10. The method of manufacturing a stamper for use in an optical information recording medium as defined in claim 2, wherein a solvent for removing said photoresist film formed on said water-soluble resin layer is the solvent selected among isopropyl alcohol and acetone.

11. The method of manufacturing a stamper for use in an optical information recording medium as defined in claim 3, wherein a solvent for removing said photoresist film formed on said water-soluble resin layer is the solvent selected among isopropyl alcohol and acetone.

12. The method of manufacturing a stamper for use in an optical information recording medium as defined in claim 4, wherein a solvent for removing said photoresist film formed on said water-soluble resin layer is the solvent selected among isopropyl alcohol and acetone.

13. The method of manufacturing a stamper for use in an optical information recording medium as defined in claim 5, wherein solvent for removing said photoresist film formed on said water-soluble resin layer is the solvent selected among isopropyl alcohol and acetone.

14. The method of manufacturing a stamper for use in an optical information recording medium as defined in claim 6, wherein a solvent for removing said photoresist film formed on said water-soluble resin layer is the solvent selected among isopropyl alcohol and acetone.

15. The method of manufacturing a stamper for use in an optical information recording medium as defined in claim 7, wherein a solvent for removing said photoresist film formed on said water-soluble resin layer is the solvent selected among isopropyl alcohol and acetone.

16. The method of manufacturing a stamper for use in an optical information recording medium as defined in claim 8, wherein a solvent for removing said photoresist film formed on said water-soluble resin layer is the solvent selected among isopropyl alcohol and acetone.

17. The method of manufacturing a stamper for use in an optical information recording medium as defined in claim 1,
    wherein, after peeling off said Ni plate, when said water-soluble resin layer remaining on and attached to the surface of said Ni plate is removed and cleaned, pure water is used as the cleaning liquid.

18. The method of manufacturing a stamper for use in an optical information recording medium as defined in claim 2, wherein, after peeling off said Ni plate, when said water-soluble resin layer remaining on and attached to the surface of said Ni plate is removed and cleaned, pure water is used as the cleaning liquid.

19. The method of manufacturing a stamper for use in an optical information recording medium as defined in claim 3, wherein, after pealing off said Ni plate, when said water-soluble resin layer remaining on and attached to the surface of said Ni plate is removed and cleaned, pure water is used as the cleaning liquid.

20. The method of manufacturing a stamper for use in an optical information recording medium as defined in claim 4, wherein, after peeling off said Ni plate, when said water-soluble resin layer remaining on and attached to the surface of said Ni plate is removed and cleaned, pure water is used as the cleaning liquid.

21. The method of manufacturing a stamper for use in an optical information recording medium as defined in claim 5, wherein, after peeling off said Ni plate, when said water-soluble resin layer remaining on and attached to the surface of said Ni plate is removed and cleaned, pure water is used as the cleaning liquid.

22. The method of manufacturing a stamper for use in an optical information recording medium as defined in claim 6, wherein, after peeling off said Ni plate, when said water-soluble resin layer remaining on and attached to the surface of said Ni plate is removed and cleaned, pure water is used as the cleaning liquid.

23. The method of manufacturing a stamper for use in an optical information recording medium as defined in claim 7, wherein, after peeling off said Ni Plate, when said water-soluble resin layer remaining on and attached to the surface of said Ni plate is removed and cleaned, pure water is used as the cleaning liquid.

24. The method of manufacturing a stamper for use in an optical information recording medium as defined in claim 8, wherein, after peeling off said Ni plate, when said water-soluble resin layer remaining on and attached to the surface of said Ni plate is removed and cleaned, pure water is used as the cleaning liquid.

25. The method of manufacturing a stamper for use in an optical information recording medium as defined in claim 9, wherein, after peeling off said Ni plate, when said water-soluble resin layer remaining on and attached to the surface of said Ni plate is removed and cleaned, pure water is used as the cleaning liquid.

26. The method of manufacturing a stamper for use in an optical information recording medium as defined in claim 10, wherein, after peeling off said Ni plate, when said water-soluble resin layer remaining on and attached to the surface of said Ni plate is removed and cleaned, pure water is used as the cleaning liquid.

27. The method of manufacturing a stamper for use in an optical information recording medium as defined in claim 11, wherein, after peeling off said Ni plate, when said water-soluble resin layer remaining on and attached to the surface of said Ni plate is removed and cleaned, pure water is used as the cleaning liquid.

28. The method of manufacturing a stamper for use in an optical information recording medium as defined in claim 12, wherein, after peeling off said Ni plate, when said water-soluble resin layer remaining on and attached to the surface of said Ni plate is removed and cleaned, pure water is used as the cleaning liquid.

29. The method of manufacturing a stamper for use in an optical information recording medium as defined in claim 13, wherein, after peeling off said Ni plate, when said water-soluble resin layer remaining on and attached to the surface of said Ni plate is removed and cleaned, pure water is used as the cleaning liquid.

30. The method of manufacturing a stamper for use in an optical information recording medium as defined in claim 14,
    wherein, after pealing off said Ni plate, when said water-soluble resin layer remaining on and attached to the surface of said Ni plate is removed and cleaned, pure water is used as the cleaning liquid.

31. The method of manufacturing a stamper for use in a optical information recording medium as defined in claim 15, wherein, after peeling off said Ni plate, when said water-soluble resin layer remaining on and attached to the surface of said Ni plate is removed and cleaned, pure water is used as the cleaning liquid.

32. The method of manufacturing a stamper for use in an optical information recording medium as defined in claim 16, wherein, after peeling off said Ni plate, when said water-soluble resin layer remaining on and attached to the surface of said Ni plate is removed and cleaned, pure water is used as the cleaning liquid.

33. A method of exposing the master plate in manufacturing a stamper for use in an optical information recording medium as defined in any one of claims 1 through 6, wherein, when a predetermined groove pattern is formed on said photoresist film, in order to control the bottom width of the groove formed on said photoresist film where said water-soluble resin layer is exposed, the thickness of said photoresist film is made constant and the intensity of the light beam for exposing said photoresist film is changed.

34. A method of exposing the master plate in manufacturing a stamper for use in an optical information recording medium as defined in either one of claims 1 through 6, wherein, when a predetermined groove pattern is formed on said photoresist film, in order to control the bottom width of the groove formed on said photoresist film where said water-soluble resin layer is exposed, the intensity of the light beam for exposing said photoresist film is made constant and the thickness of said photoresist film is changed.

* * * * *